United States Patent
Liang et al.

(10) Patent No.: US 7,243,186 B2
(45) Date of Patent: Jul. 10, 2007

(54) METHOD OF OPTIMIZING PERFORMANCE OF FLASH MEMORY

(75) Inventors: Ming-Nen Liang, Hsinchu Hsien (TW); Chee-Kong Awyong, Hsinchu Hsien (TW)

(73) Assignee: Phison Electronics Corp., Hsinchu (TW)

(*) Notice: Subject to any disclaimer, the term of this patent is extended or adjusted under 35 U.S.C. 154(b) by 0 days.

(21) Appl. No.: 11/599,377

(22) Filed: Nov. 15, 2006

(65) Prior Publication Data

US 2007/0061506 A1 Mar. 15, 2007

Related U.S. Application Data

(63) Continuation of application No. 10/740,682, filed on Dec. 22, 2003, now Pat. No. 7,159,068.

(51) Int. Cl.
*G06F 12/00* (2006.01)
(52) U.S. Cl. .................. 711/103; 711/102; 711/155

(58) Field of Classification Search .............. None
See application file for complete search history.

(56) References Cited

U.S. PATENT DOCUMENTS 4,835,678 A * 5/1989 Kofuji .................. 711/118
5,675,797 A * 10/1997 Chung et al. ............ 718/104

* cited by examiner

*Primary Examiner*—T Nguyen
(74) *Attorney, Agent, or Firm*—Jianq Chyun IP Office

(57) ABSTRACT

A method of optimizing performance of a flash memory is provided. According to the method of the present invention, a page or a block can be selected as a unit for writing data to the flash memory. When the flash memory controller process the step of writing data into the flash memory, the volume of data is calculated for determining the time and frequency of moving and erasing data for both page and block as a unit. Based on the above result, the most appropriate method of writing data is selected to substantially improve speed of the writing process and also to reduce the frequency of erasing steps in order to extend the service life of the flash memory.

3 Claims, 11 Drawing Sheets

METHOD OF OPTIMIZING PERFORMANCE OF FLASH MEMORY

This application is a Continuation of Application of my patent application Ser. No. 10/740,682, filed on Dec. 22, 2003 now U.S. Pat. No. 7,159,068.

BACKGROUND OF THE INVENTION

1. The Field of the Invention

The present invention relates to a method of optimizing performance of a flash memory, and more particularly relates to a method of controlling a flash memory for selecting a page or a block as a unit to process the steps of retrieving or saving data to the flash memory.

2. Description of Related Art

In the conventional method of reading data from any address in a page, due to the physical characteristics of the conventional flash memory, a page is usually taken as a reading unit. For writing data, the flash memory takes a block as a unit and erases the whole block and then writes data into pages in a order of page by page. Thus if the volume of the data is smaller than a block, then data processing is accordingly limited due to the structure limits.

For writing data into a page of the flash memory completely, the physical characteristics of the flash memory requires a page should be absolutely blank or have no data therein and the volume of the data should be equal to a sector. Therefore, the page should be verified that it is completely blank or has no data therein before writing data into page. The term "blank" here means, the data in every pages of the block are "1". According to the conventional writing method a block is taken as a unit, and therefore to write data into one page of the block, the flash memory has to find an absolutely blank block, namely, a backup block, and then the data is written into the blank page of the new block. So the data in the old block is completely moved into the new block and then, the old block is erased. The old block after being completely erased serves as a new block.

When the volume of the data is equivalent to a few continuous pages, the flash memory controller finds a new block from the flash memory for writing the data into the page thereof; then to move the data into the page of the new block, and after writing of the data is completed, the old block is erased. Because in a host, for instance, a computer, a card reader, a cellular phone and the like, the file arrangement table (FAT) of the flash memory is often updated, and if the data is usually for small files, the flash memory has to work repeatedly according to the rule of first finding a new block, moving data into the new block and then erasing the old block.

Frequent erasing steps would easily damage the internal structure of the flash memory. It is found that after one million times of erasing steps, the flash memory easily gets damaged. Therefore, by reducing the frequency of erasing steps, the service life of the flash memory can be extended. Accordingly, for writing data, if a block is taken as a unit, the erasing frequency cannot be reduced and therefore the service life of the flash memory is limited.

SUMMARY OF THE INVENTION

Accordingly, in the view of the foregoing, the present inventor makes a detailed study of related art to evaluate and consider, and uses years of accumulated experience in this field, and through several experiments, to create a method for reducing the frequency of erasing steps of the flash memory. The present invention provides an innovated cost effective a method for reducing the frequency of erasing steps of the flash memory so that the service life of the flash memory can be substantially promoted.

According to an aspect of the present invention, for writing data, a page or a block can be selected as a unit for efficiently managing the flash memory. When a host, for instance, a computer, card reader, cellular phone and the like, processes the step of writing data into the flash memory, the volume of data is calculated by the flash controller for determining the time and frequency of moving and erasing data for both page and block as a unit. Based on the above result, the most appropriate method of writing data is selected to substantially improve the speed of the writing process and also to reduce the frequency of erasing steps, i.e., the number of erasing steps carried out in a given period of time, in order to extend the service life of the flash memory.

BRIEF DESCRIPTION OF THE DRAWING

For a more complete understanding of the present invention, reference will now be made to the following detailed description of preferred embodiments taken in conjunction with the following accompanying drawings.

DETAILED DESCRIPTION OF PREFERRED EMBODIMENTS

Figure 1:
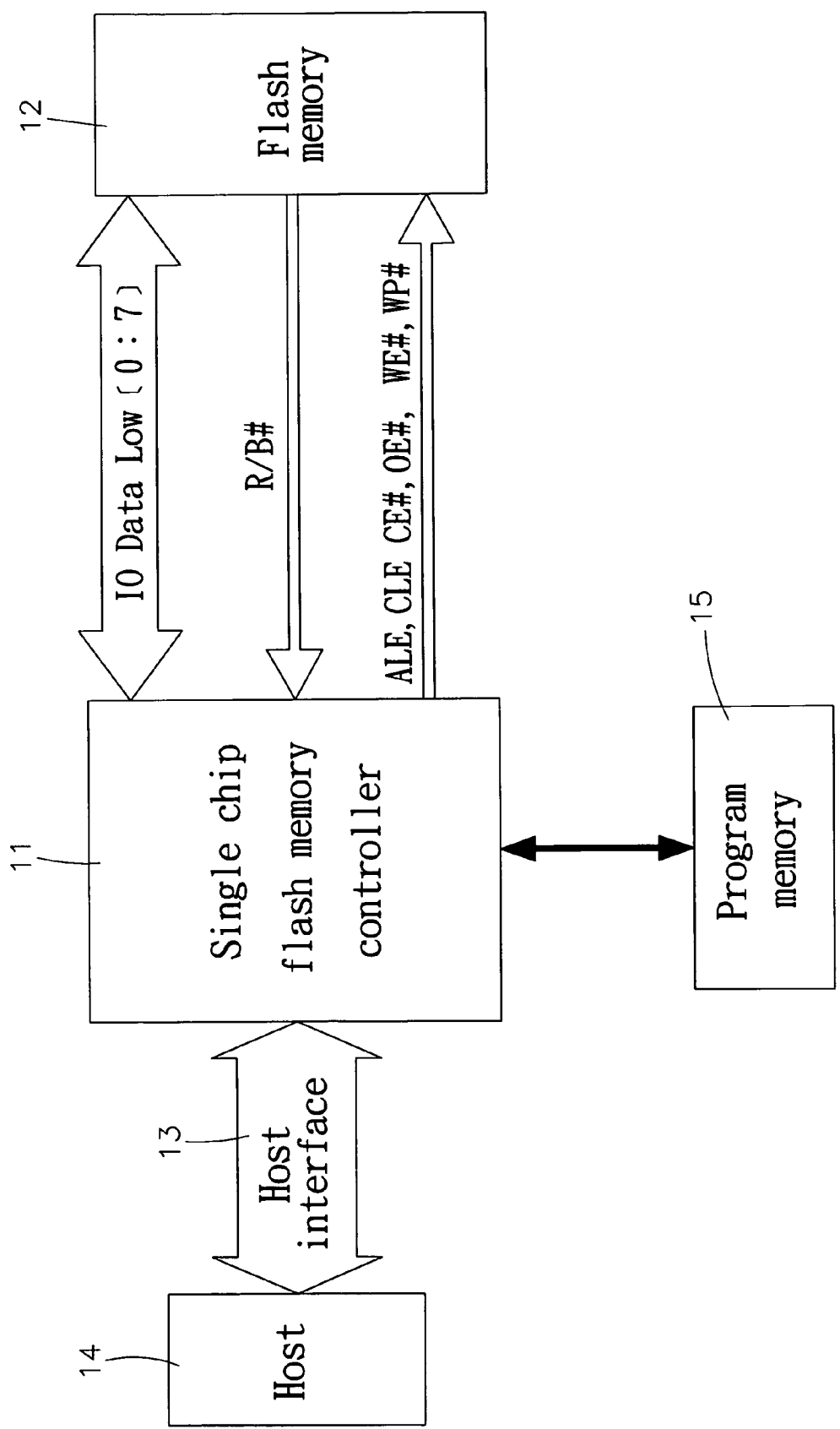
FIG. 1 is a block diagram of a system including a flash memory according to a preferred embodiment of the present invention.

Reference will be made in detail to the preferred embodiments of the invention, examples of which are illustrated in the accompanying drawings. Wherever possible, the same reference numbers are used in the drawings and the description to refer to the same or like parts.

Referring to FIG. 1, a block diagram of a system including a flash memory according to a preferred embodiment of the present invention is shown. The system comprises a single chip flash memory controller 11, a flash memory 12, a host interface 13 and a host 14. The single chip flash memory controller 11 is connected to the flash memory 12, and through the host interface 13 to connect to the host 14, for example, a computer, a card reader, a cellular phone and the like, allowing the host 14 to control the single chip flash memory controller 11 to save/retrieve data to/from the flash memory 12. The single chip flash memory controller 11 has a program memory 15 inlayed inside or attached outside enabling the single chip flash memory controller 11 to process saving/retrieving to the flash memory 12 according to the preset program of the program memory 15.

Figure 2:
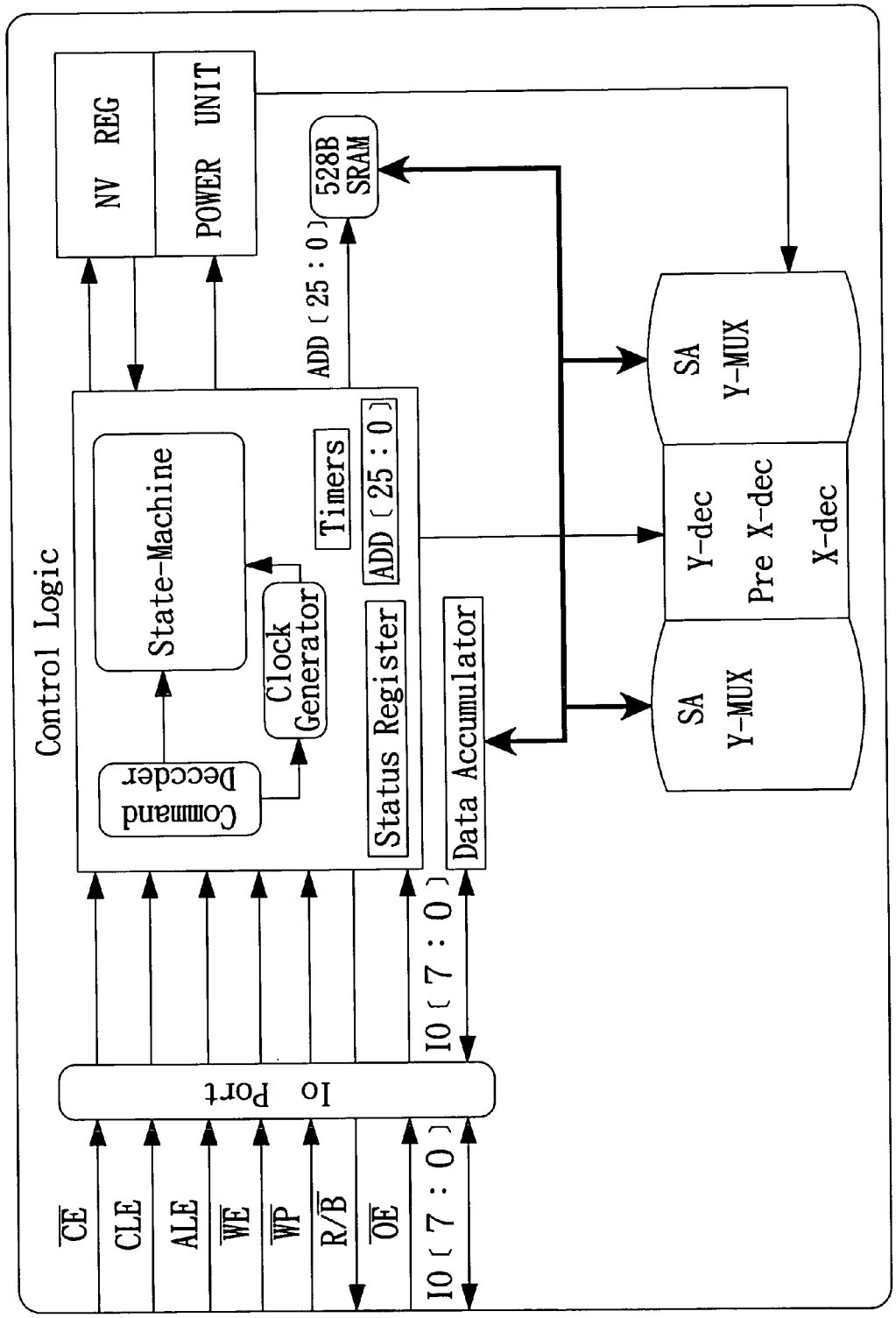
FIG. 2 is a block diagram of a flash memory using a page as a unit according to a preferred embodiment of the present invention.
Figure 3:
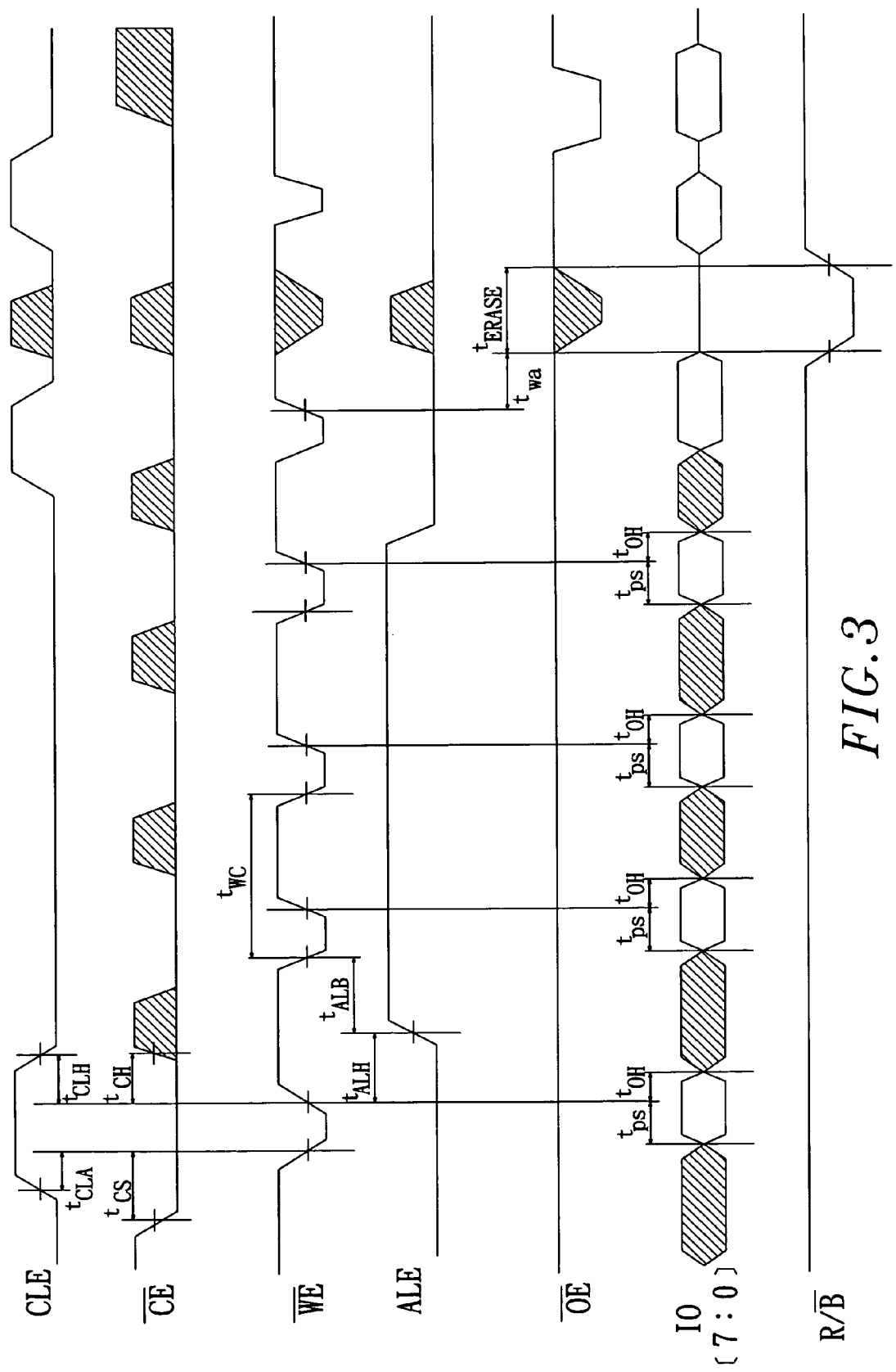
FIG. 3 is a timing chart for processing erasing step according to a preferred embodiment of the present invention.
Figure 4:
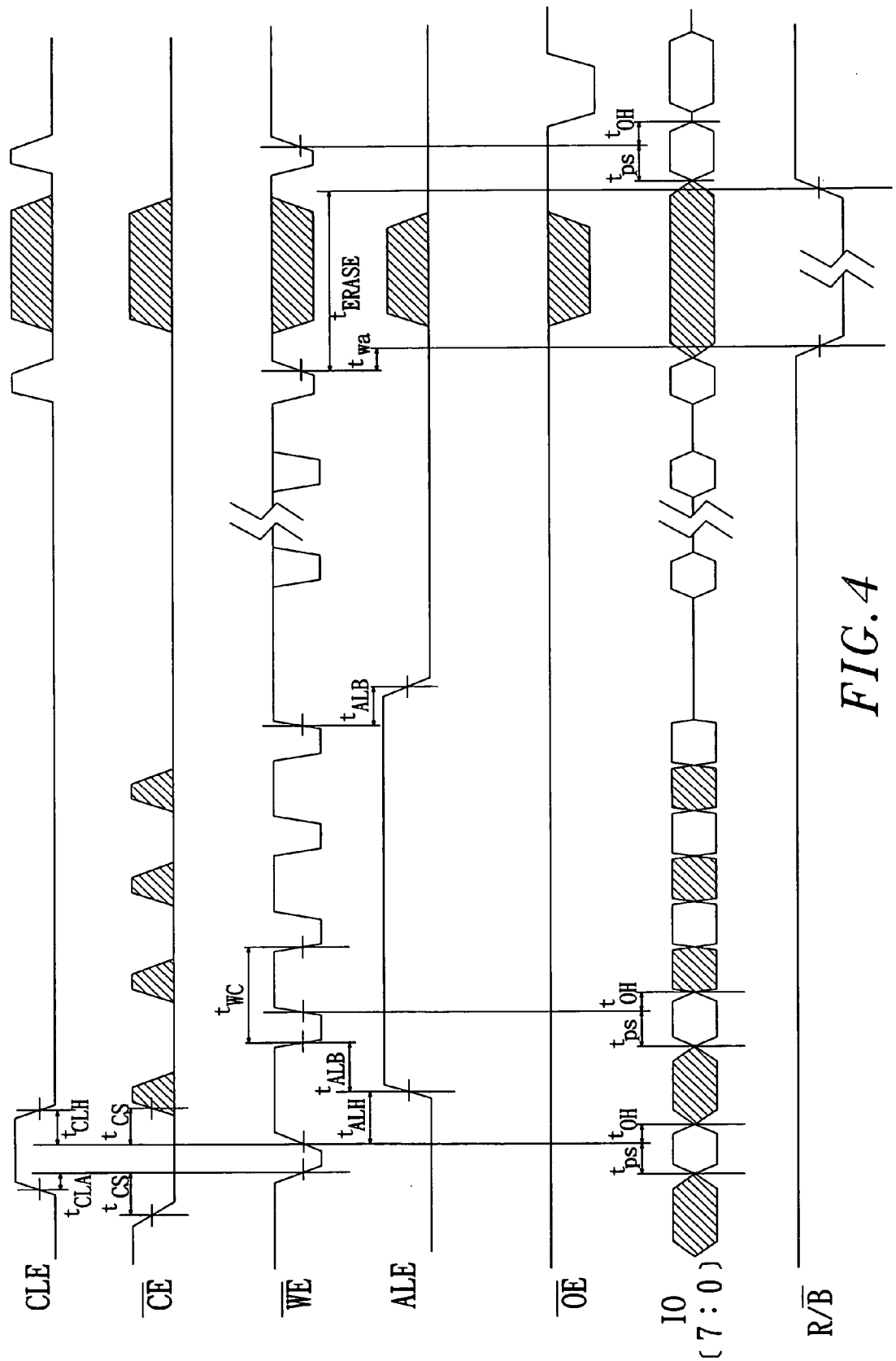
FIG. 4 is a timing chart for processing writing step using a page as a unit according to a preferred embodiment of the present invention.

Referring to FIG. 2, a block diagram of a flash memory using a page as a unit according to a preferred embodiment of the present invention is shown. The flash memory has to erase a block or a page every time before writing data therein. An erasing timing chart is shown in FIG. 3 in which a page is taken as a writing unit, and a writing timing chart is shown in FIG. 4 in which a page is taken as a writing unit.

Figure 5:
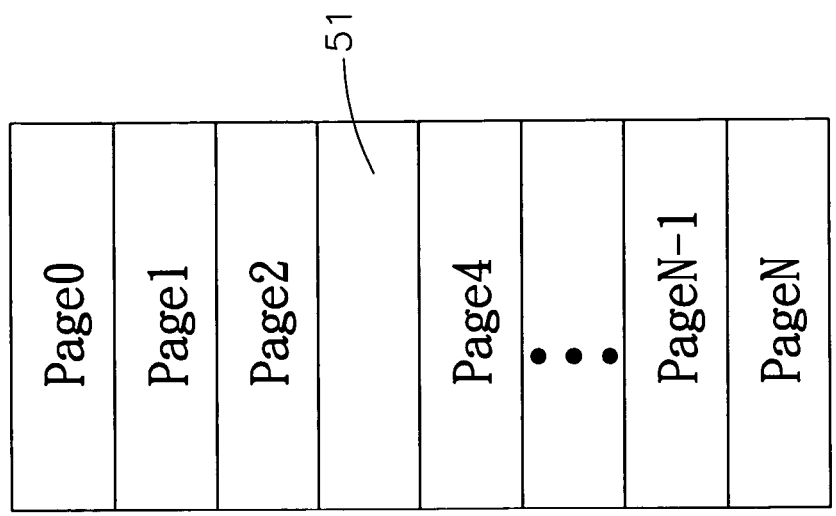
FIG. 5 is a block diagram illustrating an erasing step of a page according to preferred embodiment of the present invention.
Figure 5:
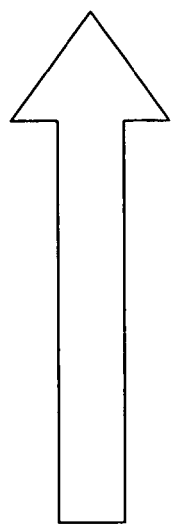
Figure 5:
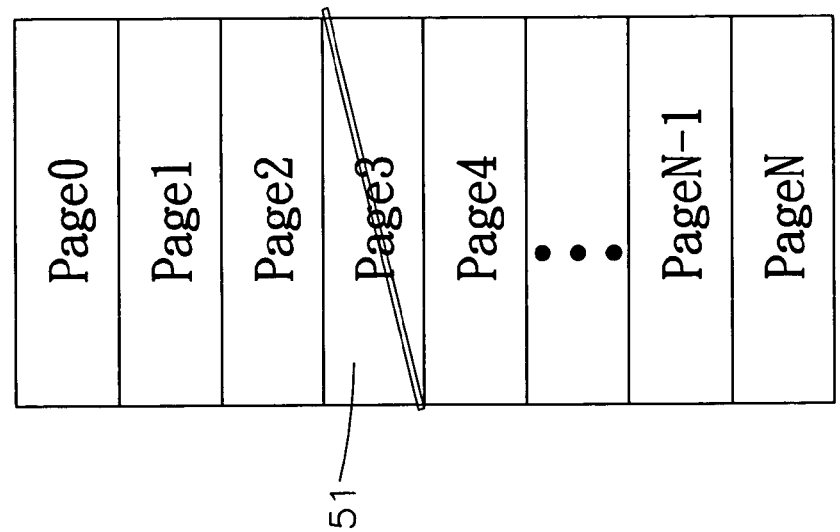
Figure 6:
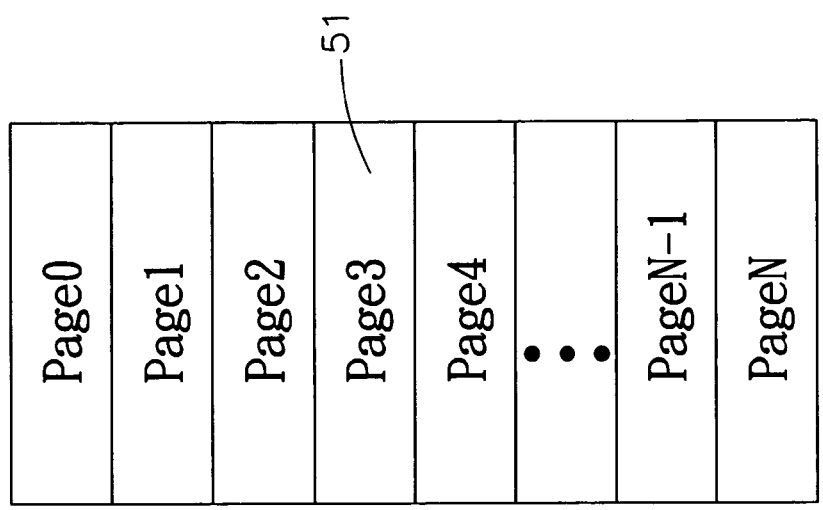
FIG. 6 is a block diagram showing a writing data using a page as a unit according to a preferred embodiment of the present invention.
Figure 6:
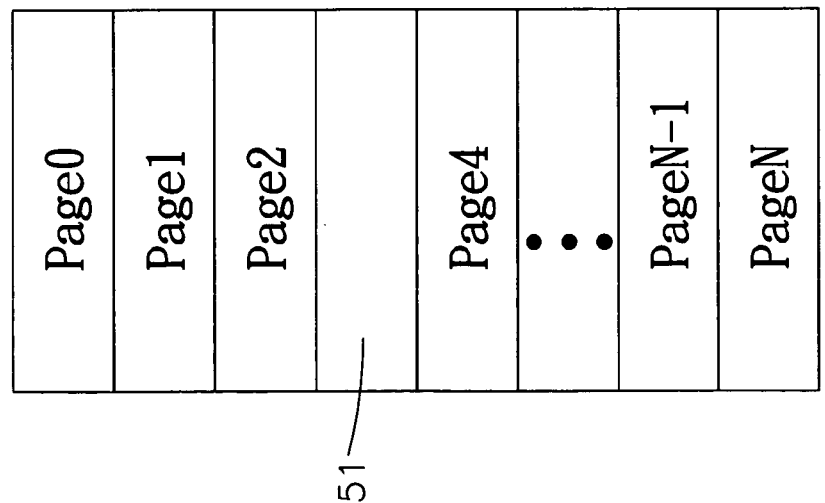
Figure 7:
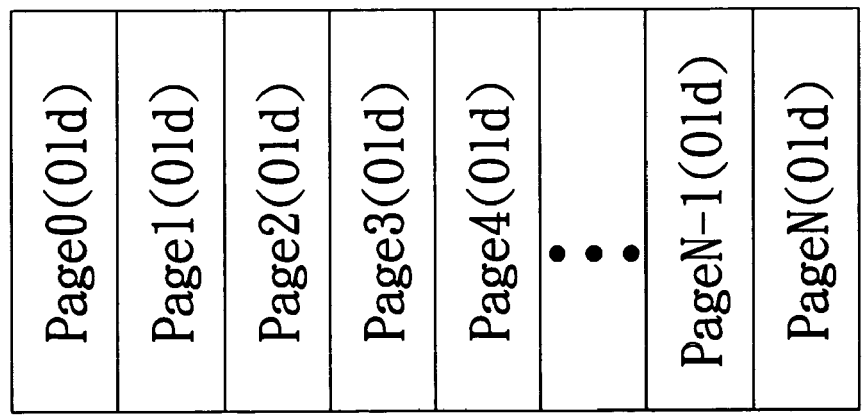
FIG. 7 is a block diagram (I) illustrating a writing data using a block as a unit according to a preferred embodiment of the present invention.
Figure 8:
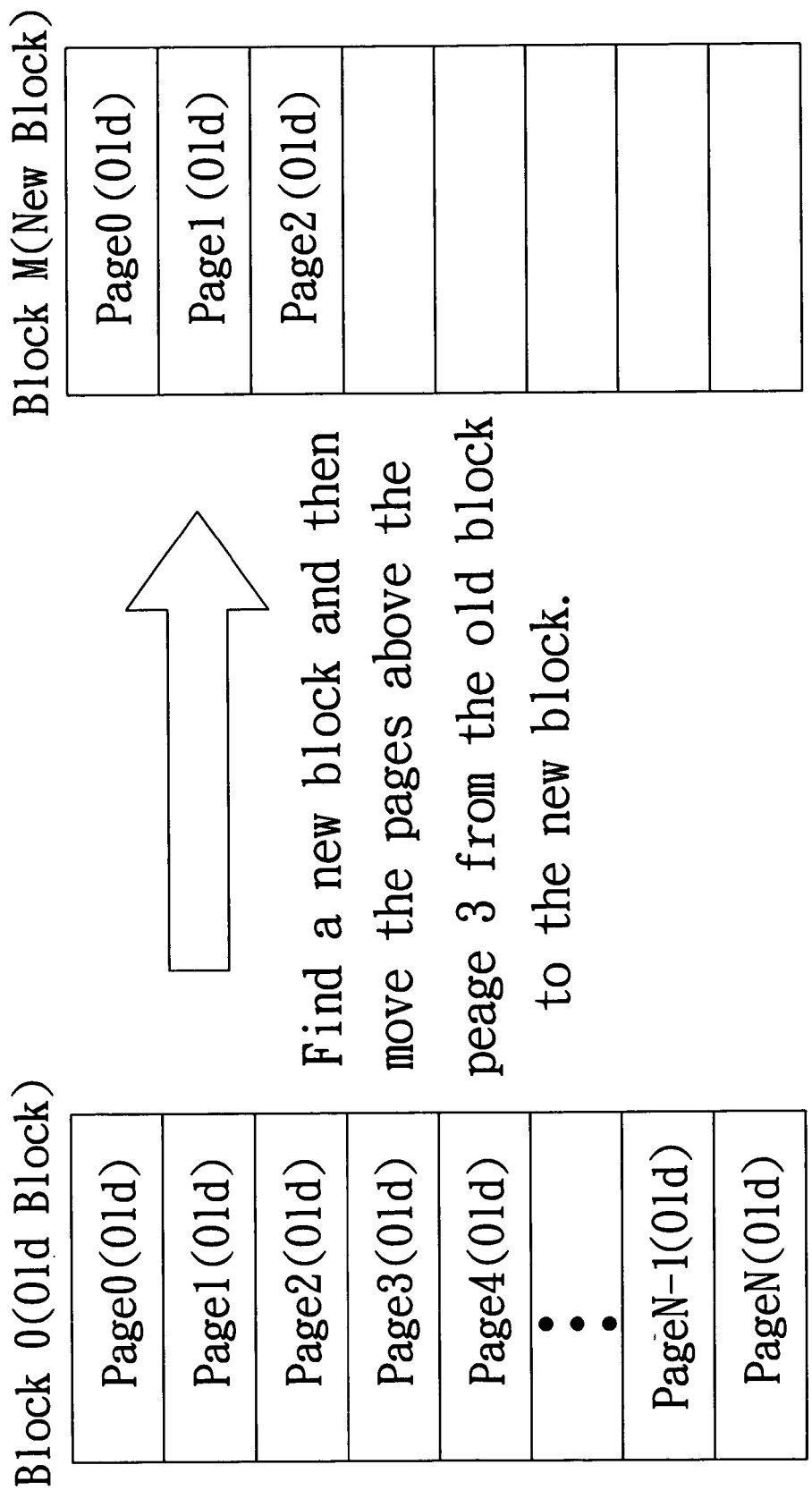
FIG. 8 is a block diagram (II) illustrating a writing data using a block as a unit according to a preferred embodiment of the present invention.
Figure 9:
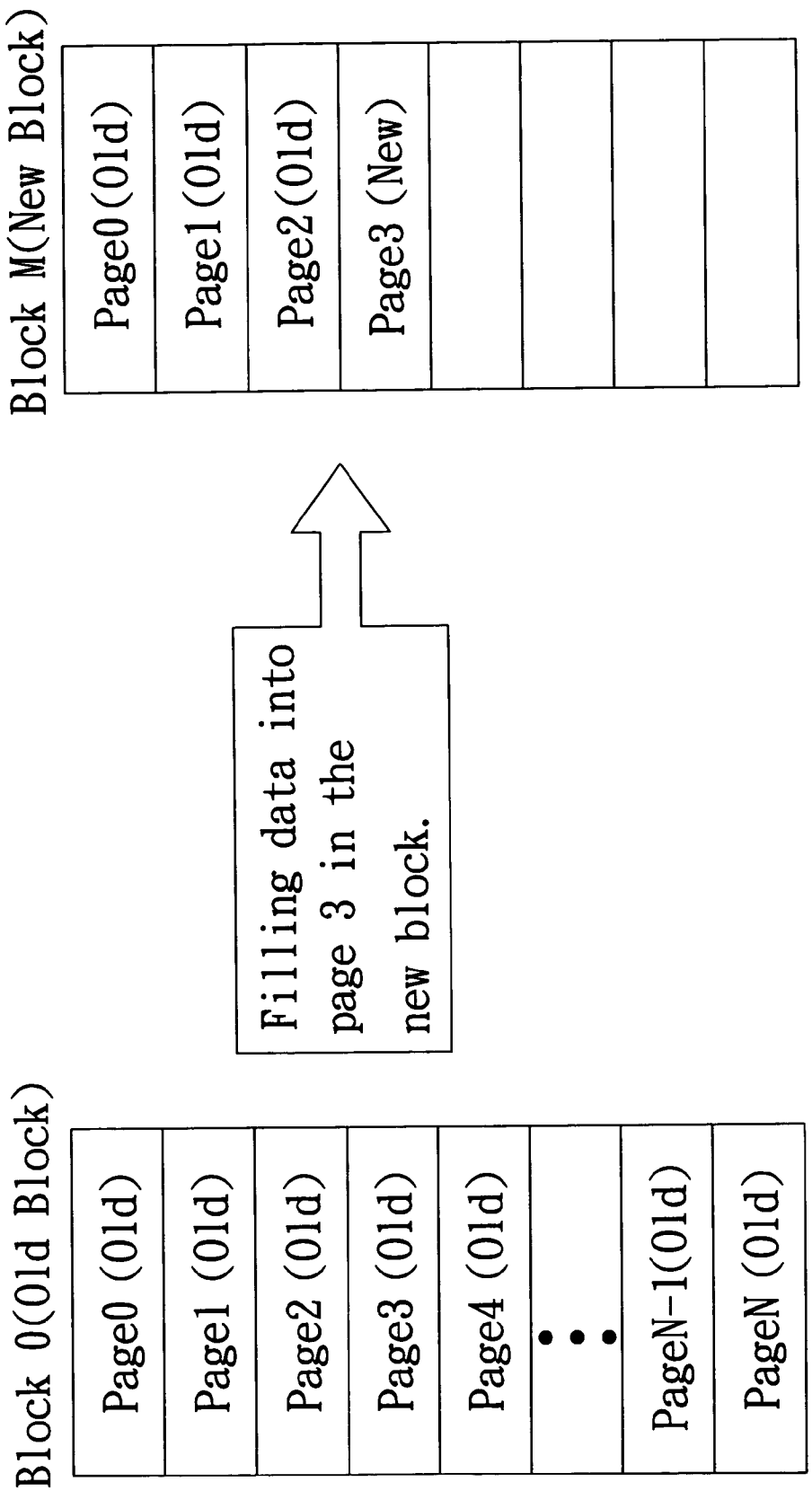
FIG. 9 is a block diagram (III) illustrating a writing data using a block as a unit according to a preferred embodiment of the present invention.
Figure 10:
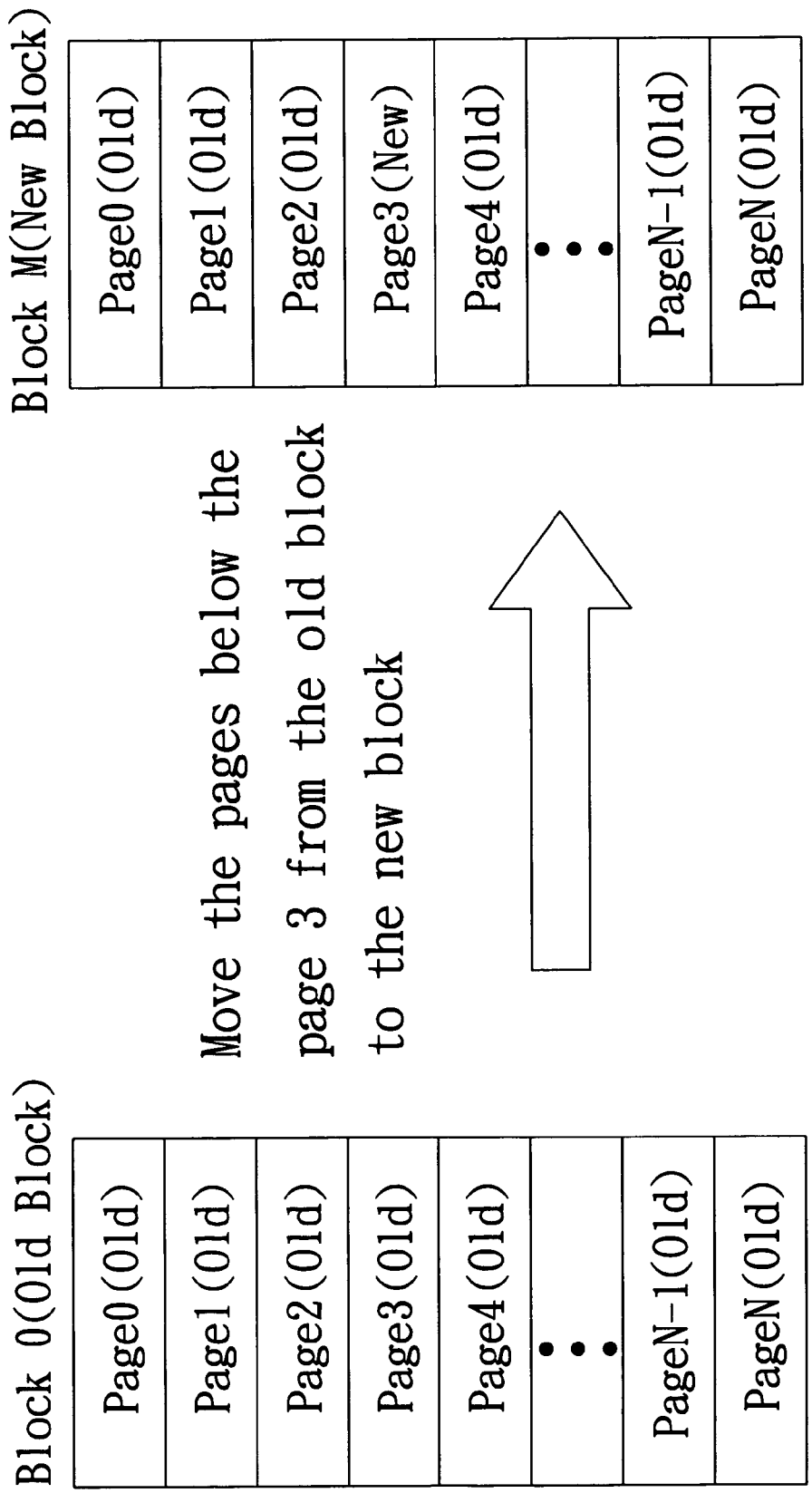
FIG. 10 is a block diagram (IV) illustrating a writing data using a block as a unit according to a preferred embodiment of the present invention.
Figure 11:
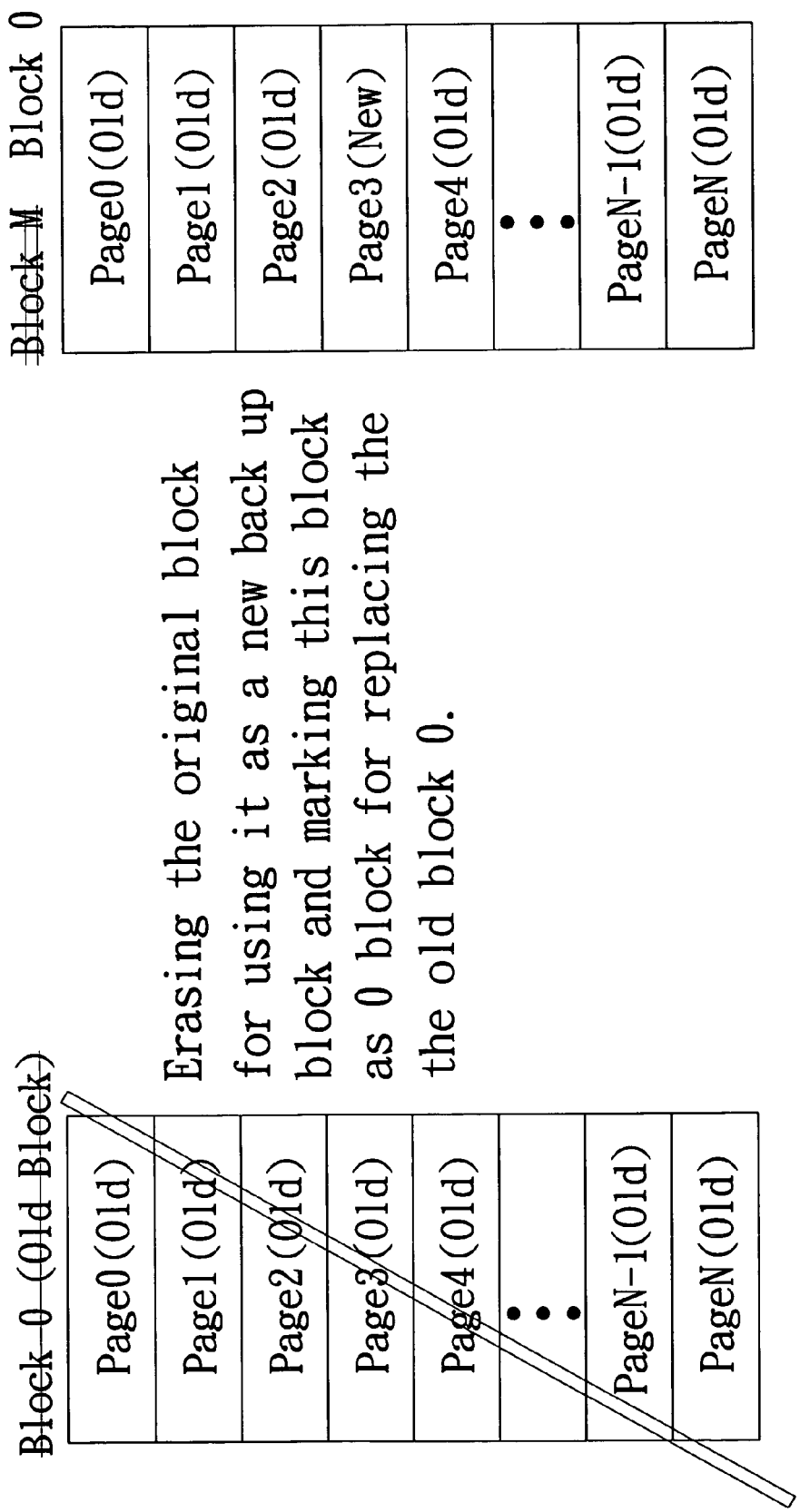
FIG. 11 is a block diagram (V) illustrating a writing data using a block as a unit according to a preferred embodiment of the present invention.

In the present invention, referring to FIGS. 1, 5 and 6, the method of writing data allows the use of a new block (backup block) to move the new data into pages according to the volume of data, or directly to erase the page 51 that needs to be updated in order to render the page 51 blank (as shown in FIG. 5) and then fill the new data into page 51 (as shown in FIG. 6). Accordingly, the frequency of erasing steps can be reduced to effectively extend the service life of the flash memory 12.

According to the specification, for example, the time for erasing a page or a block is about 4 mini seconds (ms). The page program time is about 200 micron seconds ($\mu s$). As there are 32 pages in a block, therefore, the block program time is 32 times of the page program time (200 $\mu s \times 32$), which is equal to 6.4 ms. The time for reading a page is about 5 $\mu s$ latency plus 50 ns multiplied by 528, which is equal to 31.4 $\mu s$. Therefore, because the conventional method of managing usually uses a block as a unit, to refresh a page within the block, unless the data in a new page is input from an outer controller, the preset data in 31 pages has to be moved from the old block to the new block (as shown in FIGS. 7, 8, 9, 10 and 11), and therefore the time required is at least the block erasing time multiplied by 1 plus the time required for reading a page multiplied by 31 and the resulting total time plus the page program time multiplied by 32. Accordingly, the result is equal to 11.37 ms. However, when using a page as a unit for managing, as shown in FIGS. 5 and 6, the time required is only the a page erasing time plus a page program time, which is equal to 4.2 ms, and thereby the time for moving 31 pages from the old block to the new block can be effectively skipped.

However, time for erasing a page or a block is same, namely, 4 ms, and therefore, if the data in all 32 pages are different from the original one and requires total erasure of the block, for writing data, the necessary procedure is to only erase pages, the time required is the total erasing time for erasing 32 pages, which is equal to the time required for erasing a page multiplied by 32 plus the total page program time for 32 pages, which is the page program time multiplied by 32, and accordingly the total time is equal to 134.4 ms, which is significantly more than the time for erasing an entire block, and on top of this, the total page program time of 32 pages has to be added, which is 10.4 ms. Therefore, it is wise to select a page as a unit or a block as a unit depending on the page program time, page erasing time, page reading and block erasing time in the specification of the flash memory 12. Accordingly, when the volume of the data to be processed is small, or equal to a page, it is advantageous to select a page as a unit. On the other hand, it is advantageous to select a block as a unit when the volume of the data to be process is equivalent to multiple pages. Therefore, for writing data to flash memory, by selecting a page as a unit when the volume of the data is small, and selecting a block as a unit when the volume is equal to multiple pages, would be accordingly advantageous to substantially reduce the writing time. Further, this would also significantly reduce the frequency of erasing steps and therefore the service life of the flash memory can be significantly reduced.

The following description will now describe how a volume of a page to be processed is determined as being small or large in considering various time figures for calculating the most benefiting result.

First of all, say PR represents the page reading time, PP represents the page program time, PE represents the page erase time and BE represents the block erase time. Now to use a page erasing method to process several pages, say N number of pages, the time required for processing is $PE*N+PP*N$; and the time required for processing using the block erasing method is $BE*1+PR*(32-N)+PP*32$. By comparing the above two results, the time which ever of the above is less entered as the data processing selection parameter of the flash memory 12, for example, in a form of a equation expressed by $PE*N+PP*N<BE*1+PR*(32-N)+PP*32$, wherein PE=4 ms, PP=200 $\mu s$, PR=31.4 $\mu s$ and BE=4 ms, resulting to N<2.6. Thus the most efficient data processing method of using page erasing can be selected benefiting shorter processing time and thereby reducing the frequency of the erasing steps when N<2.6. The above result is based on that the time for erasing a page or a block erase is same for the flash memory 12, and accordingly, if a new specification for the flash memory page erasing time in the future is lower than the block erasing time, the N value can be accordingly increased for selecting the best options for managing the data processing of the flash memory according to the objects of the present invention.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

The invention claimed is:

1. A method of optimizing performance of a flash memory, comprising the step of:
   (a) providing a flash memory controller, wherein said flash memory controller is connected to said flash memory, and said flash memory controller is programmed for calculating, according to a volume of said data, a time of moving and erasing said data for a page as a unit, and a time of moving and erasing said data for a block as a unit; and
   (b) selecting either a page as a unit or a block as a unit according to a result of said calculation of said time of moving and erasing data for said page as a unit and for said block as a unit.

2. The method of optimizing performance of a flash memory according to claim 1, wherein the step of calculating a time (TIME) of moving and erasing said data for a page includes the steps of erasing data, reading the data of the page(s), programming the page(s) and writing the data to the page(s) using a page as a unit, and is expressed by the following equation:

$$TIME = PE*N + PP*N$$

wherein PP represents the time for programming the page(s), PE represents the time for erasing the page(s), and N represents the total number of pages.

3. The method of optimizing performance of a flash memory according to claim 1, wherein the step of calculating a time (TIME) of moving and erasing said data for a page includes the steps of erasing data, reading the data of the page(s), programming the page(s) and writing the data to the page(s) using a page as a unit, and is expressed by the following equation:

$$TIME = BE*1 + PR*(32-N) + PP*32$$

wherein PR represents the time for reading the data of the page(s), PP represents the time for programming the page(s), N represents the total number of pages, and BE represents the time for erasing the block.

* * * * *